(12) United States Patent
Otsuka et al.

(10) Patent No.: US 12,237,435 B2
(45) Date of Patent: *Feb. 25, 2025

(54) METHOD FOR MANUFACTURING SUBSTRATE FOR SOLAR CELL AND SUBSTRATE FOR SOLAR CELL

(71) Applicant: SHIN-ETSU CHEMICAL CO., LTD., Tokyo (JP)

(72) Inventors: Hiroyuki Otsuka, Karuizawa-machi (JP); Shozo Shirai, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/521,384

(22) Filed: Nov. 28, 2023

(65) Prior Publication Data

US 2024/0136464 A1    Apr. 25, 2024

Related U.S. Application Data

(62) Division of application No. 15/538,893, filed as application No. PCT/JP2015/005846 on Nov. 25, 2015, now Pat. No. 11,901,475.

(30) Foreign Application Priority Data

Jan. 5, 2015    (JP) ................. 2015-000554

(51) Int. Cl.
*H01L 31/18*    (2006.01)
*C30B 29/06*    (2006.01)
(Continued)

(52) U.S. Cl.
CPC ......... *H01L 31/1804* (2013.01); *C30B 29/06* (2013.01); *C30B 31/08* (2013.01);
(Continued)

(58) Field of Classification Search
CPC ... H01L 31/0288; H01L 31/068; H01L 31/18; H01L 31/1804; H01L 31/1864;
(Continued)

(56) References Cited

U.S. PATENT DOCUMENTS 5,360,748 A    11/1994    Nadahara et al.
6,294,726 B1 *  9/2001    Hassler ................. C30B 15/206
                                                              136/258
(Continued)

FOREIGN PATENT DOCUMENTS

CN    1319253 A    10/2001
CN    1769549 A    5/2006
(Continued)

OTHER PUBLICATIONS

Jan. 11, 2024 U.S. Office Action issued in U.S. Appl. No. 16/732,954.
(Continued)

*Primary Examiner* — Mayla Gonzalez Ramos
(74) *Attorney, Agent, or Firm* — Oliff PLC (57) ABSTRACT

A solar cell includes a light-receiving surface electrode formed on a light-receiving surface, a back surface electrode formed on a backside, and a CZ silicon single crystal substrate doped with gallium. The CZ silicon single crystal substrate contains 12 ppm or more oxygen atoms. A spiral oxygen-induced defect is not observed in an EL (electroluminescence) image of the solar cell.

1 Claim, 5 Drawing Sheets

(51) Int. Cl.
  *C30B 31/08* (2006.01)
  *C30B 31/18* (2006.01)
  *C30B 33/02* (2006.01)
  *H01L 21/22* (2006.01)
  *H01L 21/324* (2006.01)
  *H01L 31/0288* (2006.01)
  *H01L 31/068* (2012.01)

(52) U.S. Cl.
  CPC ............ *C30B 31/185* (2013.01); *C30B 33/02* (2013.01); *H01L 21/22* (2013.01); *H01L 21/324* (2013.01); *H01L 31/0288* (2013.01); *H01L 31/068* (2013.01); *H01L 31/1864* (2013.01); *Y02E 10/547* (2013.01); *Y02P 70/50* (2015.11)

(58) Field of Classification Search
  CPC ....... H01L 21/22; H01L 21/324; C30B 31/08; C30B 31/18; C30B 33/02; C30B 29/06; C30B 31/185
  See application file for complete search history.

(56) References Cited

U.S. PATENT DOCUMENTS

| | | | |
|---|---|---|---|
| 6,544,656 | B1 | 4/2003 | Abe et al. |
| 6,548,886 | B1 | 4/2003 | Ikari et al. |
| 8,309,389 | B1 | 11/2012 | Alie et al. |
| 2002/0000185 | A1 | 1/2002 | Falster |
| 2008/0124929 | A1* | 5/2008 | Okuda ................. H01L 21/3225 257/E21.321 |
| 2009/0020158 | A1* | 1/2009 | Ohtsuka .............. H01L 31/0682 257/E21.135 |
| 2009/0127448 | A1* | 5/2009 | Fuyuki .................... H02S 50/10 250/238 |
| 2009/0197049 | A1 | 8/2009 | Reber et al. |
| 2010/0009521 | A1 | 1/2010 | Shiota et al. |
| 2010/0055884 | A1 | 3/2010 | Isogai et al. |
| 2010/0108139 | A1 | 5/2010 | Li |
| 2011/0020976 | A1 | 1/2011 | Watai et al. |
| 2011/0303265 | A1 | 12/2011 | Yuan et al. |
| 2012/0160311 | A1 | 6/2012 | Ha et al. |
| 2012/0174960 | A1 | 7/2012 | Hashigami et al. |
| 2012/0181667 | A1 | 7/2012 | Geerligs et al. |
| 2012/0260989 | A1* | 10/2012 | DeLuca ................. H01L 31/068 438/57 |
| 2013/0074924 | A1 | 3/2013 | Umeda |
| 2013/0192516 | A1 | 8/2013 | Chen et al. |
| 2013/0247974 | A1 | 9/2013 | Moriyama et al. |
| 2013/0284259 | A1 | 10/2013 | Jin et al. |
| 2014/0162383 | A1 | 6/2014 | Karakida |
| 2015/0017747 | A1* | 1/2015 | Lam ........................ H01L 22/12 438/98 |
| 2015/0132931 | A1 | 5/2015 | Kapur et al. |
| 2016/0013341 | A1 | 1/2016 | Chan et al. |
| 2017/0018677 | A1 | 1/2017 | Le Perchec et al. |
| 2017/0278998 | A1 | 9/2017 | Yamarin et al. |

FOREIGN PATENT DOCUMENTS

| | | |
|---|---|---|
| CN | 101167191 A | 4/2008 |
| CN | 101399297 A | 4/2009 |
| CN | 101638806 A | 2/2010 |
| CN | 101971358 A | 2/2011 |
| CN | 102153089 A | 8/2011 |
| CN | 102598308 A | 7/2012 |
| CN | 102820378 A | 12/2012 |
| CN | 102893411 A | 1/2013 |
| CN | 103201847 A | 7/2013 |
| DE | 699 37 803 T2 | 12/2008 |
| JP | 1993-206146 A | 8/1993 |
| JP | 2002-076388 A | 3/2002 |
| JP | 2010-017811 A | 1/2010 |
| JP | 2011-046565 A | 3/2011 |
| JP | 2014-143272 A | 8/2014 |

OTHER PUBLICATIONS

Feb. 2, 2016 Search Report issued in International Patent Application No. PCT/JP2015/005846.
Oct. 20, 2015 Office Action issued in Japanese Patent Application No. 2015-000554.
Jul. 11, 2017 International Reliminary Report on Patentability issued in International Patent Application No. PCT/JP2015/005846.
Aug. 14, 2018 Office Action issued in Chinese Patent Application No. 201580072513.6.
May 17, 2019 Office Action issued in Chinese Patent Application No. 201580072513.6.
Feb. 3, 2020 Decision of Refusal issued in Chinese Patent Application No. 201580072513.6.
Jun. 23, 2020 Office Action issued in U.S. Appl. No. 15/538,893.
Sep. 14, 2020 Office Action issued in Chinese Patent Application No. 201580072513.6.
Dec. 24, 2020 Office Action issued In U.S. Appl. No. 15/538,893.
Mar. 24, 2021 Office Action issued in Chinese Patent Application No. 201580072513.6.
Aug. 18, 2021 Office Action issued in U.S. Appl. No. 15/538,893.
Feb. 16, 2022 Office Action issued In U.S. Appl. No. 15/538,893.
Aug. 17, 2022 Office Action issued in U.S. Appl. No. 15/538,893.
Sep. 5, 2022 Office Action issued in Chinese Patent Application No. 202010001147.8.
Mar. 9, 2023 Office Action issued in U.S. Appl. No. 15/538,893.
May 24, 2023 Office Action issued in Chinese Patent Application No. 202010001147.8.
Jul. 20, 2023 Office Action issued in U.S. Appl. No. 15/538,893.
Aug. 24, 2023 Decision of Refusal issued in Chinese Patent Application No. 202010001147.8.
Oct. 30, 2023 Office Action issued in Chinese Patent Application No. 202110623283.5.
Apr. 5, 2024 Office Action issued in German Patent Application No. 11 2015 005 529.0.
Apr. 10, 2024 Office Action issued in Chinese Patent Application No. 202010001147.8.
Jun. 26, 2024 Office Action issued in Chinese Patent Application No. 202010001147.8.
May 27, 2024 Office Action issued in Chinese Patent Application No. 202110623283.5.
May 29, 2024 Examiner's Answer issued in U.S. Appl. No. 16/732,954.
Oct. 14, 2024 Office Action issued in Chinese Patent Application No. 202110623283.5.

* cited by examiner

METHOD FOR MANUFACTURING SUBSTRATE FOR SOLAR CELL AND SUBSTRATE FOR SOLAR CELL

The present application is a divisional application of U.S. application Ser. No. 15/538,893 filed Jun. 22, 2017, which in turn is a U.S. national stage application of PCT/JP2015/005846 filed Nov. 25, 2015. The entire disclosure of each of these prior applications is incorporated herein by reference in its entirety.

TECHNICAL FIELD

The present invention relates to a method for manufacturing a substrate for a solar cell and a substrate for a solar cell.

BACKGROUND ART

General solar cells are each provided with an electrode formed from Ag-paste material by a screen printing method, an antireflection coating of $SiN_x$ formed by a CVD method, and an emitter layer (an n-type diffusion layer) formed by thermal diffusion when a p-type silicon substrate is used therein (e.g., see Patent Document 1). In this thermal diffusion, the emitter layer is formed by vapor-phase diffusion of $POCl_3$ or coating diffusion of phosphoric acid-base material, and the substrate is subjected to a temperature of 800° C., approximately. In forming a boron diffusion layer as a BSF layer to improve the efficiency, the substrate have to be heated to 1000° C., approximately.

CITATION LIST

Patent Literature

Patent Document 1: Japanese Unexamined Patent Application publication (Kokai) No. 2002-076388

SUMMARY OF INVENTION

Problem to be Solved by the Invention

However, when a silicon single crystal substrate is subjected to thermal treatment at 800° C. or more in the thermal diffusion described above or forming an oxide film on the substrate surface, with the silicon single crystal substrate containing oxygen atoms in a certain amount or more, defects due to the oxygen can grow to decrease the minority carrier lifetime of the silicon single crystal substrate. As a result, there arises a problem to degrade the characteristics of solar cells manufactured by using such substrates. The degradation of characteristics has been obvious in a substrate with higher oxygen concentration.

The present invention was accomplished in view of the above-described problems. It is an object of the present invention to provide a method for manufacturing a substrate for a solar cell that can prevent decrease in the minority carrier lifetime of the substrate even when the substrate has higher oxygen concentration.

Means for Solving Problem

To achieve the above-described objects, the present invention provides a method for manufacturing a substrate for a solar cell composed of a single crystal silicon, comprising the steps of:

producing a silicon single crystal ingot;
slicing a silicon substrate from the silicon single crystal ingot; and
subjecting the silicon substrate to low temperature thermal treatment at a temperature of 800° C. or more and less than 1200° C.,
wherein the silicon single crystal ingot or the silicon substrate is subjected to high temperature thermal treatment at a temperature of 1200° C. or more for 30 seconds or more before the low temperature thermal treatment.

As described above, by subjecting a silicon single crystal ingot or a silicon substrate to the high temperature thermal treatment at a temperature of 1200° C. or more for 30 seconds or more before the low temperature thermal treatment at a temperature of 800° C. or more and less than 1200° C., it is possible to previously dissolve oxide precipitate nuclei, which can be origins of oxide precipitation defects. This prevents growth of oxygen-induced defects even after low temperature thermal treatment in the succeeding production process. Accordingly, it is possible to manufacture a substrate in which decrease in the minority carrier lifetime is prevented to improve the conversion efficiency of the solar cell produced by using the manufactured substrate. In the explanation of the present invention, the thermal treatment at a temperature of 800° C. or more and less than 1200° C. is referred to as "low temperature thermal treatment" for convenience to be distinguished from "high temperature thermal treatment" at a temperature of 1200° C. or more.

In this case, it is preferable that the silicon substrate is subjected to the high temperature thermal treatment after slicing the silicon substrate from the silicon single crystal ingot.

By subjecting a silicon substrate to the high temperature thermal treatment as described above, it is possible to surely dissolve oxide precipitate nuclei, which is origin of oxide precipitate defects, therefore, it is possible to surely prevent decrease in the minority carrier lifetime of the substrate.

In this case, the low temperature thermal treatment may belong to dopant diffusion treatment or oxidation treatment.

In manufacturing a substrate for a solar cell, many of dopant diffusion treatment and oxidation treatment are performed in the temperature range of the low temperature thermal treatment. The present invention can be suitably applied when the dopant diffusion treatment or oxidation treatment performing such low temperature thermal treatment is performed.

In this case, the silicon substrate may have an oxygen concentration of 12 ppm or more.

When the oxygen concentration of a silicon substrate is 12 ppm or more, degradation of the characteristics of a solar cell is particularly large in conventional methods, and the present invention can be applied suitably. Incidentally, in the explanation of the present invention, the oxygen concentration in a silicon substrate is an atomicity ratio (in this case, the unit is also described as "ppma") based on new ASTM standard.

In this case, the silicon single crystal ingot may be doped with phosphorus.

When a silicon single crystal ingot is n-type doped with phosphorus, the present invention can be applied suitably.

In this case, it is preferable that the silicon single crystal ingot is doped with gallium, and the high temperature thermal treatment be performed for 30 minutes or less.

By using gallium as a p-type dopant to dope a silicon single crystal ingot, it is possible to prevent decrease in the minority carrier lifetime of a substrate more effectively.

When the high temperature thermal treatment time is 30 minutes or less, evaporation of gallium from the substrate surface can be prevented, which can prevent increase of resistance of the substrate surface. Therefore, it is possible to prevent decrease in fill factor of a solar cell produced by using such a substrate.

In this case, the high temperature thermal treatment is preferably performed in an atmosphere that contains phosphoryl chloride.

When the high temperature thermal treatment is performed in an atmosphere that contains phosphoryl chloride, decrease in a minority carrier lifetime of the substrate can be prevented more effectively due to the strong gettering effect of phosphorus.

The present invention also provides a substrate for a solar cell that is manufactured by the method for manufacturing a substrate for a solar cell described above.

Such a substrate for a solar cell makes it possible to prevent decrease in the minority carrier lifetime of the substrate. Thereby, it is possible to improve conversion efficiency of the solar cell manufactured by using such a substrate.

Effect of Invention

As described above, the inventive method for manufacturing a substrate for a solar cell makes it possible to manufacture a substrate in which decrease in the minority carrier lifetime is prevented. Thereby, it is possible to improve conversion efficiency of the solar cell manufactured by using the produced substrate. The inventive substrate for a solar cell makes it possible to prevent decrease in the minority carrier lifetime of the substrate. Thereby, it is possible to improve conversion efficiency of the solar cell manufactured by using such a substrate.

DESCRIPTION OF EMBODIMENTS

Hereinafter, the present invention will be specifically described by reference to FIGS as an example of the embodiment, but the present invention is not limited thereto.

As described above, when a silicon single crystal substrate is subjected to thermal treatment at 800° C. or more and less than 1200° C. and the like, with the silicon single crystal substrate containing oxygen atoms in a certain amount or more, defects due to the oxygen can grow to decrease the minority carrier lifetime of the silicon single crystal substrate. As a result, there arises a problem to degrade the characteristics of solar cells manufactured by using such substrates.

Accordingly, the present inventors have diligently investigated a method for manufacturing a substrate for a solar cell that can prevent decrease in the minority carrier lifetime of the substrate even when the substrate has higher oxygen concentration. As a result, the present inventors have found that the substrate in which decrease in the minority carrier lifetime is prevented can be manufactured by subjecting a silicon single crystal ingot or a silicon substrate to high temperature thermal treatment at a temperature of 1200° C. or more for 30 seconds or more before low temperature thermal treatment at a temperature of 800° C. or more and less than 1200° C., thereby previously dissolving oxide precipitate nuclei, which originates oxide precipitation defects, to prevent growth of the oxygen-induced defects even after low temperature thermal treatment in the succeeding production process; thereby bringing the present inventive to completion.

Figure 1:
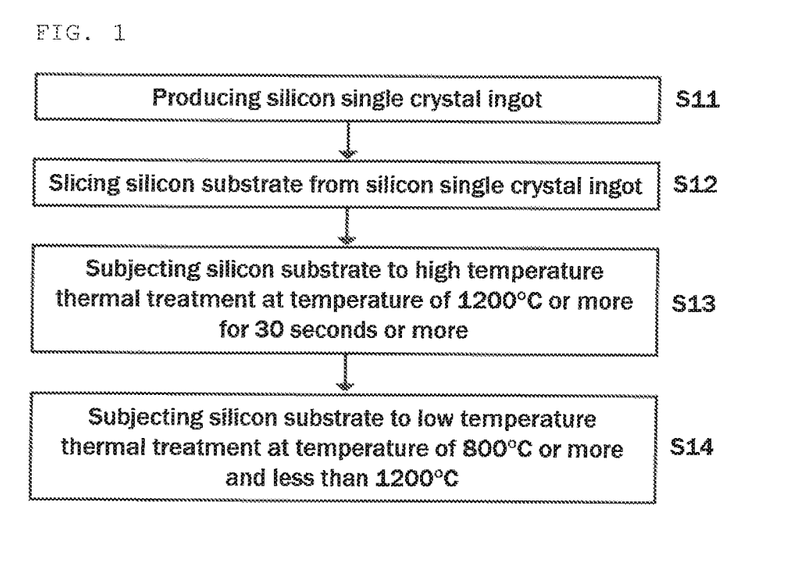
FIG. 1 is a flow diagram showing an example of the embodiment of the inventive method for manufacturing a substrate for a solar cell.

The following describes an example of the embodiment of the inventive method for manufacturing a substrate for a solar cell (the first embodiment) by reference to FIG. 1.

First, a silicon single crystal ingot is produced (see Step S11 in FIG. 1). Specifically, a silicon single crystal ingot is produced by a CZ method (Czochralski method), for example. At this stage, the silicon single crystal ingot can be doped with n-type dopant or p-type dopant so as to have a desired conductivity type. It is to be noted that in growth of a silicon single crystal by a CZ method, oxygen is incorporated to the silicon single crystal from a quartz crucible storing raw material melt.

Then, the silicon single crystal ingot produced in Step S11 is cut into a slice of a silicon substrate (see Step S12 in FIG. 1). Specifically, a silicon substrate with a certain thickness is sliced to a wafer shape from the silicon single crystal ingot by using a dicing saw, a wire saw, etc.

Subsequently, the silicon substrate sliced in Step S12 is subjected to high temperature thermal treatment at a temperature of 1200° C. or more for 30 seconds or more (see Step S13 in FIG. 1). Herein, the temperature of the high temperature thermal treatment means the maximum temperature applied to a silicon substrate during the thermal treatment; the high temperature thermal treatment time means a period to hold the temperature of 1200° C. or more. Incidentally, the high temperature thermal treatment can be performed by using a lamp annealing apparatus, a horizontal furnace, a vertical furnace, etc. The upper limit temperature of the high temperature thermal treatment is the melting point of silicon theoretically.

After Step S13, the silicon substrate is subjected to low temperature thermal treatment at a temperature of 800° C. or more and less than 1200° C. in the process of manufacturing a substrate for a solar cell (see Step S14 in FIG. 1).

As described above, a silicon substrate is subjected to the high temperature thermal treatment at a temperature of 1200° C. or more for 30 seconds or more before the low temperature thermal treatment to previously dissolve (to form a solid solution of) oxide precipitate nuclei, which is origins of oxide precipitation defects. This prevents growth of oxygen-induced defects even after low temperature thermal treatment in the succeeding production process. Accordingly, it is possible to manufacture a substrate in which decrease in the minority carrier lifetime is prevented. Thereby, the conversion efficiency of the solar cell produced by using the manufactured substrate can be improved.

Subsequently, another example of the embodiment of the inventive method for manufacturing a substrate for a solar cell (the second embodiment) will be described by reference to FIG. 2. The explanation overlapping with the first embodiment will be omitted appropriately.

Figure 2:
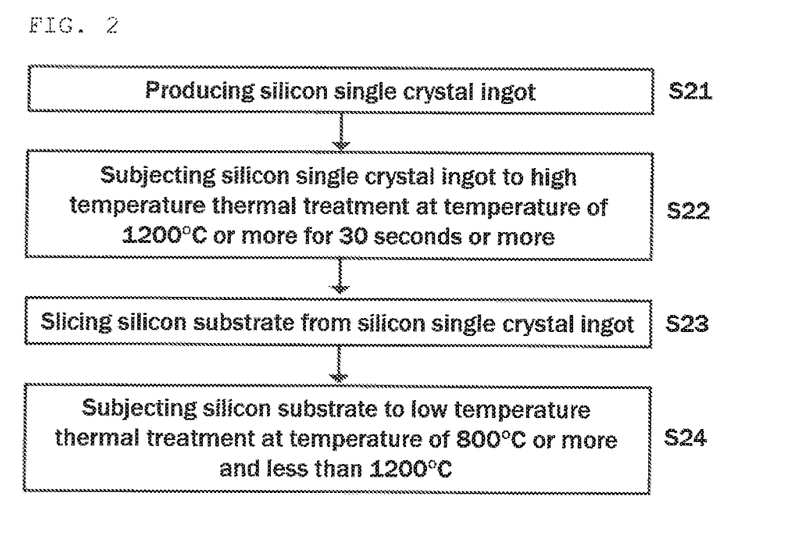
FIG. 2 is a flow diagram showing another example of the embodiment of the inventive method for manufacturing a substrate for a solar cell.

First, a silicon single crystal ingot is produced (see Step S21 in FIG. 2).

Then, the silicon single crystal ingot produced in Step S21 is subjected to high temperature thermal treatment at a temperature of 1200° C. or more for 30 seconds or more (see Step S22 in FIG. 2).

Subsequently, the silicon single crystal ingot subjected to the high temperature thermal treatment is cut into a slice of silicon substrate (see Step S23 in FIG. 2).

Then, the silicon substrate is subjected to low temperature thermal treatment at a temperature of 800° C. or more and less than 1200° C. in a process of manufacturing a substrate for a solar cell (see Step S24 in FIG. 2).

As described above by using FIG. 2, the high temperature thermal treatment can be performed on the silicon single crystal ingot in the present invention.

In both of the first embodiment and the second embodiment described above, the low temperature thermal treatment may belong to dopant diffusion treatment or oxidation treatment. In manufacturing a substrate for a solar cell, many of dopant diffusion treatment and oxidation treatment are performed as the low temperature thermal treatment described above. The present invention can be suitably applied when each of the dopant diffusion treatment and oxidation treatment to perform such a low temperature thermal treatment is performed as the low temperature thermal treatment in the present invention.

In this process, the oxygen concentration of the silicon substrate can be 12 ppm (12 ppma, new ASTM standard) or more. The present invention can be suitably applied when the silicon substrate has an oxygen concentration of 12 ppm or more. In particular, a silicon single crystal ingot produced by a CZ method (a CZ crystal) tends to form a silicon substrate, which is sliced from the ingot, with a high oxygen concentration of 12 ppm or more. The oxygen concentration tends to be high particularly in an initial stage of pulling the CZ crystal (at a cone side). When the oxygen concentration varies depending on the position in one silicon single crystal ingot as described above, it is possible to form a substrate for a solar cell without eliminating a silicon substrate with higher oxygen concentration.

In this process, the silicon single crystal ingot can be doped with phosphorus. When the silicon single crystal ingot is n-type doped with phosphorus, the present invention can be applied suitably.

In this process, it is preferable that the silicon single crystal ingot is doped with gallium, and the high temperature thermal treatment is performed for 30 minutes or less. By using gallium as a p-type dopant to dope a silicon single crystal ingot, it is possible to prevent decrease in the minority carrier lifetime of a substrate more effectively. When the high temperature thermal treatment time is 30 minutes or less, evaporation of gallium from the substrate surface can be prevented, which can prevent increase of resistance of the substrate surface. Thereby, it is possible to prevent decrease in fill factor of a solar cell produced by using such a substrate.

In this process, it is preferable that the high temperature thermal treatment be performed in an atmosphere that contains phosphoryl chloride. When the high temperature thermal treatment is performed in an atmosphere that contains phosphoryl chloride, decrease in a minority carrier lifetime of the substrate can be prevented more effectively due to the strong gettering effect of phosphorus. In this atmosphere that contains phosphoryl chloride, the substrate comes to be doped with phosphorus. This does not cause a problem because a phosphorus-doped substrate, for example, have been originally doped with phosphorus; a gallium-doped substrate is doped with n-type dopant anyway in forming a p-n junction.

Figure 3:
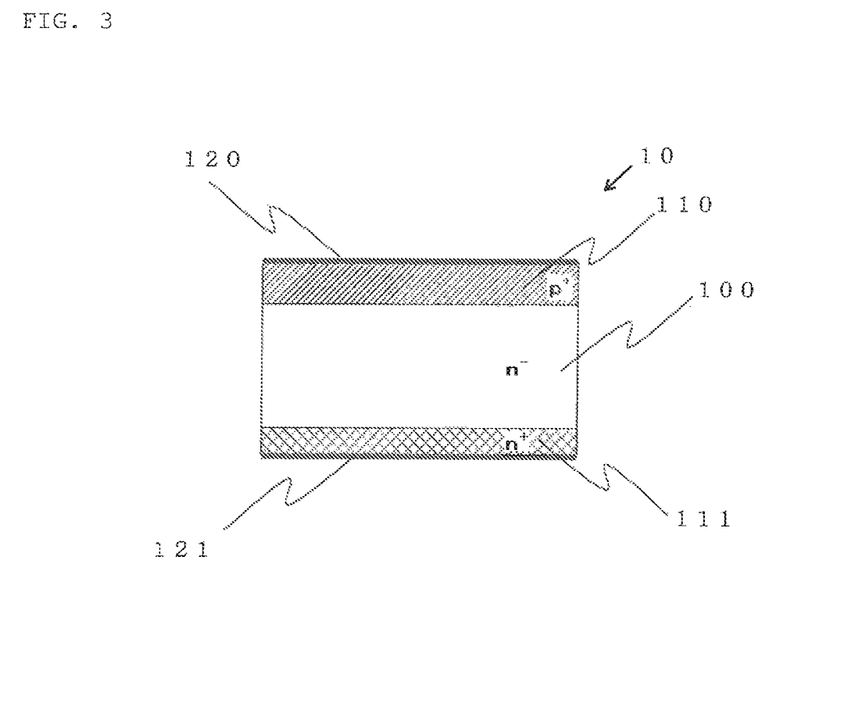
FIG. 3 is a sectional view showing an example of the inventive substrate for a solar cell.

The following describes an example of the embodiment of the inventive substrate for a solar cell by reference to FIG. 3.

The substrate for a solar cell 10 of FIG. 3 is produced by the method for manufacturing a substrate for a solar cell described above by using FIG. 1 and FIG. 2. The substrate for a solar cell 10 has, for example, the phosphorus-doped silicon substrate 100, the emitter layer (boron diffusion layer) 110 provided on the light-receiving surface of the phosphorus-doped silicon substrate 100, and the BSF layer (phosphorus diffusion layer) 111 provided on the backside of the phosphorus-doped silicon substrate 100. The emitter layer 110 is provided with the light-receiving surface antireflection coating 120 on the light-receiving surface thereof, and the BSF layer 111 is provided with the back surface antireflection coating 121 on the back surface thereof.

The substrate for a solar cell 10 have been produced by performing high temperature thermal treatment at a temperature of 1200° C. or more for 30 seconds or more on the silicon single crystal ingot or the silicon substrate before performing low temperature thermal treatment at a temperature of 800° C. or more and less than 1200° C. Accordingly, oxide precipitate nuclei, which originate oxide precipitate defects, have been dissolved previously. This prevents growth of the oxide precipitate defects even after low temperature thermal treatment in the succeeding production. The low temperature thermal treatment herein includes boron diffusion thermal treatment to form the emitter layer 110, for example. The substrate for a solar cell 10 is a substrate in which the decrease in a minority carrier lifetime is prevented as described above, which makes it possible to improve the conversion efficiency of the solar cell produced by using such a substrate.

Figure 4:
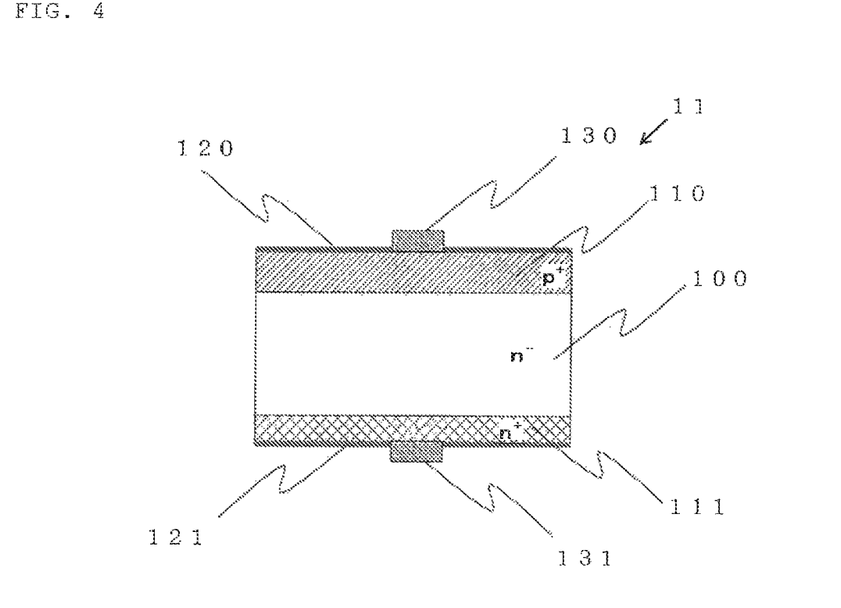
FIG. 4 is a sectional view showing an example of a solar cell fabricated by using the substrate for a solar cell of FIG. 3.

The following describes an example of the embodiment of a solar cell fabricated by using the substrate for a solar cell 10 by reference to FIG. 4.

The solar cell 11 of FIG. 4 is provided with the light-receiving surface electrode 130 on the light-receiving surface of the emitter layer 110 of the substrate for a solar cell 10, and provided with the back surface electrode 131 on the back surface of the BSF layer 111 of the substrate for a solar cell 10. Incidentally, FIG. 4 shows an example of the solar cell 11 in which the light-receiving surface electrode 130 is electrically connected with the emitter layer 110 passing through the light-receiving surface antireflection coating 120, and the back surface electrode 131 is electrically connected with the BSF layer 111 passing through the back surface antireflection coating 121.

Subsequently, an example of the inventive manufacturing method of the substrate for a solar cell 10 of FIG. 3 (an embodiment by using a phosphorus-doped substrate) will be described by reference to FIG. 5. The present invention is not limited to the following manufacturing method of the substrate for a solar cell.

Figure 5:
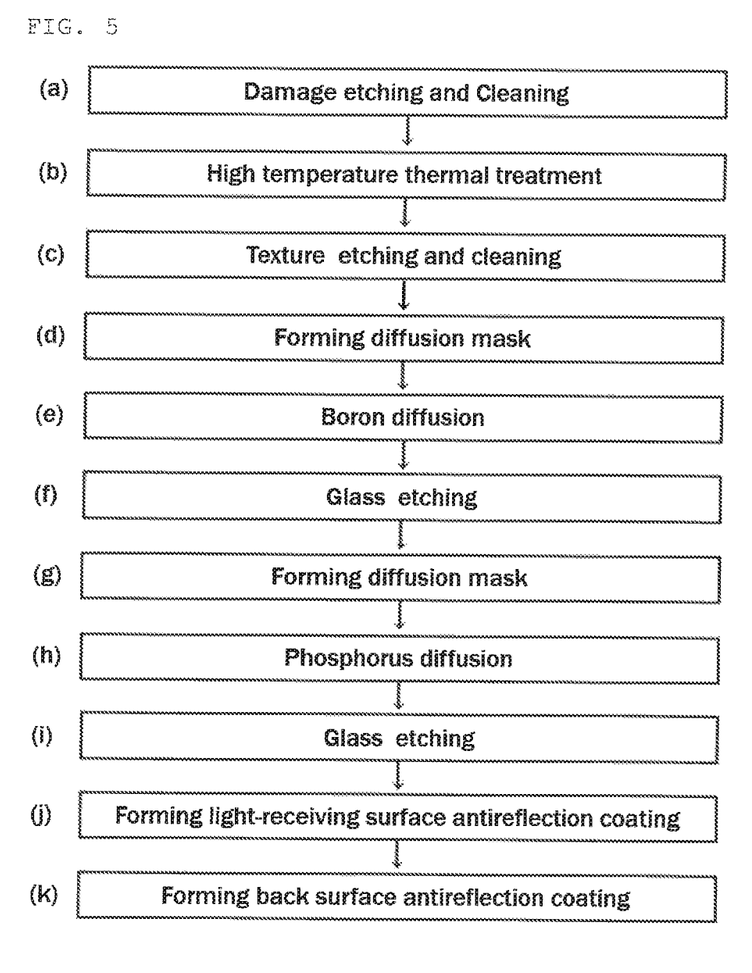
FIG. 5 is a flow diagram showing a process flow to manufacture the substrate for a solar cell of FIG. 3.

First, the phosphorus-doped silicon substrate 100 sliced from a silicon single crystal ingot is cleaned after removing the damaged layer (see FIG. 5(*a*)). The removal of the damaged layer can be performed by dipping the phosphorus-doped silicon substrate 100 into hot concentrated potassium hydroxide aqueous solution, for example.

Subsequently, the phosphorus-doped silicon substrate 100 with the damaged layer being removed is subjected to the high temperature thermal treatment at a temperature of 1200° C. or more for 30 seconds or more (see FIG. 5(*b*)). In this process, the high temperature thermal treatment can be performed by using a lamp annealing apparatus, a horizontal furnace, a vertical furnace, etc.

The phosphorus-doped silicon substrate 100 after the high temperature thermal treatment is subsequently subjected to texture etching followed by cleaning (see FIG. 5(*c*)). The texture etching can be performed by dipping into aqueous solution of potassium hydroxide/2-propanol, for example. It is to be noted that the texture etching makes it possible to form fine roughness which is called as texture to reduce the reflectance of the light-receiving surface. Incidentally, this texture forming process can be performed before the high temperature thermal treatment. In this case, it is also possible to perform the high temperature thermal treatment and a step of forming a diffusion mask of the next step continuously by using a horizontal furnace, etc.

Then, on the phosphorus-doped silicon substrate 100 subjected to the texture etching, a diffusion mask for forming the emitter layer 110 is formed (see FIG. 5(*d*)). The formation of diffusion mask can be performed by putting the phosphorus-doped silicon substrate 100 into a horizontal furnace, and growing oxide films by thermal oxidation, followed by etching the oxide film on one side thereof, for example. At this stage, the oxidation is suitably performed by wet oxidation, which can grow an oxide film faster than dry oxidation, preferably pyrogenic oxidation also in view of the cost. This thermal oxidation may be performed at a temperature which is in a range of temperature of "the low temperature thermal treatment".

Subsequently, the phosphorus-doped silicon substrate 100 having the diffusion mask formed thereon is subjected to boron diffusion (see FIG. 5(*e*)). The boron diffusion can be performed by putting the phosphorus-doped silicon substrate 100 into a horizontal furnace, followed by thermal treatment in an atmosphere of argon and $BBr_3$ gas, for example. By this step, the emitter layer (boron diffusion layer) 110 is formed. This thermal treatment is performed at a temperature of 1000° C., approximately (in the temperature range of "the low temperature thermal treatment"), for example.

Then, the phosphorus-doped silicon substrate 100 is treated with hydrofluoric acid to remove boron glass and a silicon oxide film formed on the surface thereof (see FIG. 5(*f*)).

Subsequently, a diffusion mask for forming the BSF layer 111 is formed on the phosphorus-doped silicon substrate 100 subjected to the boron diffusion (see FIG. 5(*g*)). The formation of the diffusion mask can be performed by putting the substrate 100 having the emitter formed thereon into a horizontal furnace, and growing the oxide film by thermal oxidation, followed by etching of the oxide film on the back surface. This thermal oxidation treatment can also be performed at a temperature which is in the temperature range of "the low temperature thermal treatment".

Then, the phosphorus-doped silicon substrate 100 having the diffusion mask formed thereon is subjected to phosphorus diffusion (see FIG. 5(*h*)). The phosphorus diffusion can be performed by putting the phosphorus-doped silicon substrate 100 into a horizontal furnace, followed by thermal treatment in an atmosphere of oxygen and $POCl_3$ gas, for example. By this step, the BSF layer (phosphorus diffusion layer) 111 is formed. In this phosphorus diffusion using $POCl_3$, the substrate is commonly subjected to heat with the temperature of 800° C., approximately.

Next, the phosphorus-doped silicon substrate 100 is treated with hydrofluoric acid to remove phosphorus glass and a silicon oxide film formed on the surface thereof (see FIG. 5(*i*)). A passivation film of an oxide film or an aluminum oxide film may be formed on the surface of the phosphorus-doped silicon substrate 100 to improve the conversion efficiency. As this formation of passivation film, an oxide film can be formed by thermal oxidation, LPCVD, etc.; an aluminum oxide film can be formed by PECVD, ALD, etc.

Subsequently, the light-receiving surface antireflection coating 120 is formed on the light-receiving surface of the emitter layer 110 of the phosphorus-doped silicon substrate 100 (see FIG. 5(*j*)). The formation of the light-receiving surface antireflection coating 120 can be performed by forming a silicon nitride film by plasma CVD, for example.

Then, the back surface antireflection coating 121 is formed on the back surface of the BSF layer 111 of the phosphorus-doped silicon substrate 100 (see FIG. 5(*k*)). The formation of the back surface antireflection coating 121 can be performed by forming a silicon nitride film by plasma CVD, for example.

In the foregoing way, the substrate for a solar cell 10 of FIG. 3 can be manufactured.

Figure 6:
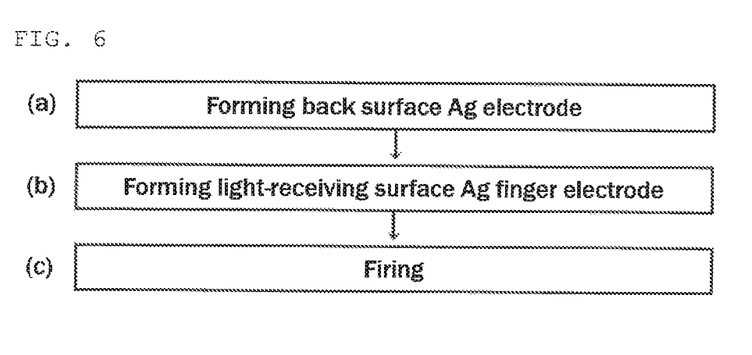
FIG. 6 is a flow diagram showing a process flow to fabricate the solar cell of FIG. 4.

The following describes an example of a method for fabricating the solar cell 11 of FIG. 4 by using the substrate for a solar cell 10 of FIG. 3 by reference to FIG. 6.

First, the back surface electrode 131 is formed on the back surface of the back surface antireflection coating 121 of the substrate for a solar cell 10 (see FIG. 6(*a*)). The back surface electrode 131 can be formed by screen printing in a desired pattern by using silver paste, for example.

Subsequently, the light-receiving surface electrode 130 is formed on the light-receiving surface of the light-receiving surface antireflection coating 120 of the substrate for a solar cell 10 (see FIG. 6(*b*)). The light-receiving surface electrode 130 can be formed by screen printing in a desired pattern by using silver paste, for example.

Then, firing is performed on the substrate for a solar cell 10 on which the back surface electrode 131 and the light-receiving surface electrode 130 are formed (see FIG. 6(*c*)). The firing temperature is 600 to 850° C., for example. It is to be noted that the light-receiving surface electrode 130 and the emitter layer 110 as well as the back surface electrode 131 and the BSF layer 111 can be electrically connected, by passing the back surface electrode 131 and the light-receiving surface electrode 130 through the light-receiving surface antireflection coating 120 and the back surface antireflection coating 121 during the firing without forming opening in the light-receiving surface antireflection coating 120 and the back surface antireflection coating 121.

In the foregoing way, the solar cell 11 of FIG. 4 can be fabricated.

Figure 7:
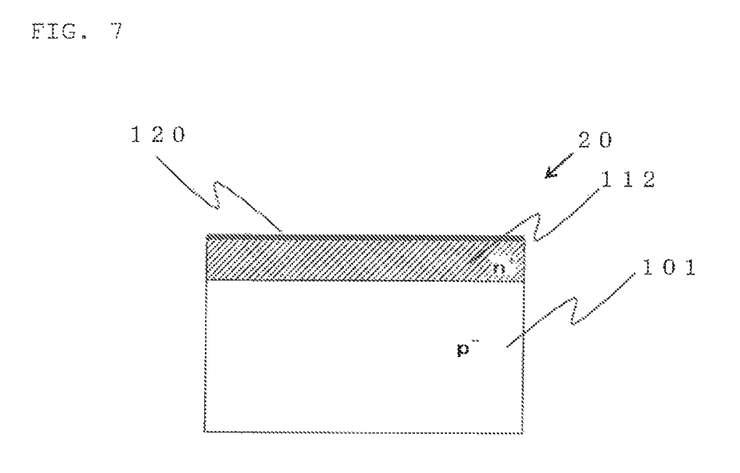
FIG. 7 is a sectional view showing another example of the inventive substrate for a solar cell.

The following describes another example of the embodiment of the inventive substrate for a solar cell by reference to FIG. 7.

The substrate for a solar cell 20 of FIG. 7 is manufactured by using the method for manufacturing a substrate for a solar cell described above by using FIG. 1 and FIG. 2. The substrate for a solar cell 20 has the gallium-doped silicon substrate 101 and the emitter layer (phosphorus diffusion layer) 112 provided on the light-receiving surface side of the gallium-doped silicon substrate 101, for example. The emitter layer 112 is provided with the light-receiving surface antireflection coating 120 on the light-receiving surface thereof.

The substrate for a solar cell 20 is manufactured by subjecting the silicon single crystal ingot or the silicon substrate to high temperature thermal treatment at a temperature of 1200° C. or more for 30 seconds or more before the low temperature thermal treatment at a temperature of 800° C. or more and less than 1200° C. Accordingly, oxide precipitate nuclei, which originate oxide precipitation defects, have been dissolved previously. This prevents growth of oxygen-induced defects even after low temperature thermal treatment in the following production process. The low temperature thermal treatment in this process is a phosphorus diffusion thermal treatment for forming the emitter layer 112, for example. The substrate for a solar cell 20 is a substrate in which decrease in the minority carrier lifetime is prevented as described above, thereby making it possible to improve the conversion efficiency of the solar cell produced by using such a substrate.

Figure 8:
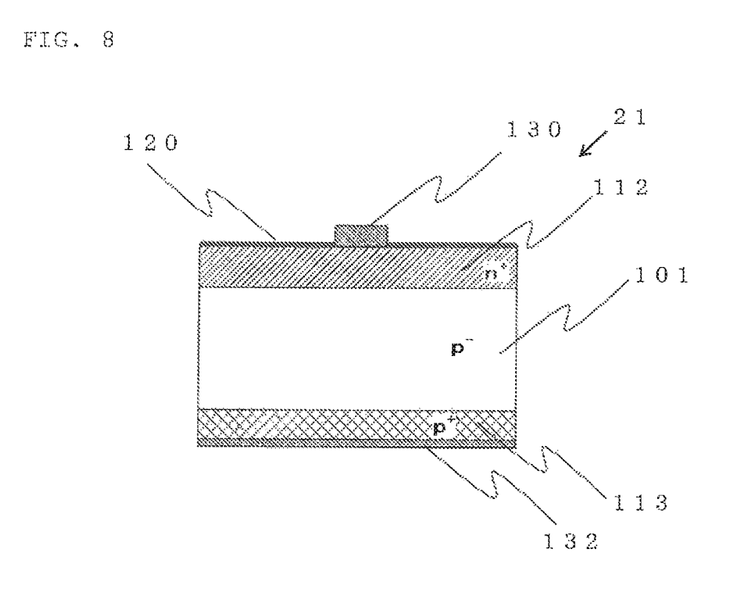
FIG. 8 is a sectional view showing another example of a solar cell fabricated by using the substrate for a solar cell of FIG. 7.

The following describes another example of the embodiment of a solar cell fabricated by using the substrate for a solar cell 20 by reference to FIG. 8.

In the solar cell 21 of FIG. 8, the emitter layer 112 of the substrate for a solar cell 20 is provided with the light-receiving surface electrode 130 on the light-receiving surface thereof, the back surface of the substrate for a solar cell 20 is provided with the back surface aluminum electrode 132, and the back side of the substrate for a solar cell 20 is provided with the BSF layer (aluminum diffusion layer) 113. In the solar cell 21 of FIG. 8, the light-receiving surface electrode 130 is electrically connected with the emitter layer 112, passing through the light-receiving surface antireflection coating 120, and the back surface aluminum electrode 132 is electrically connected with the BSF layer 113.

Figure 9:
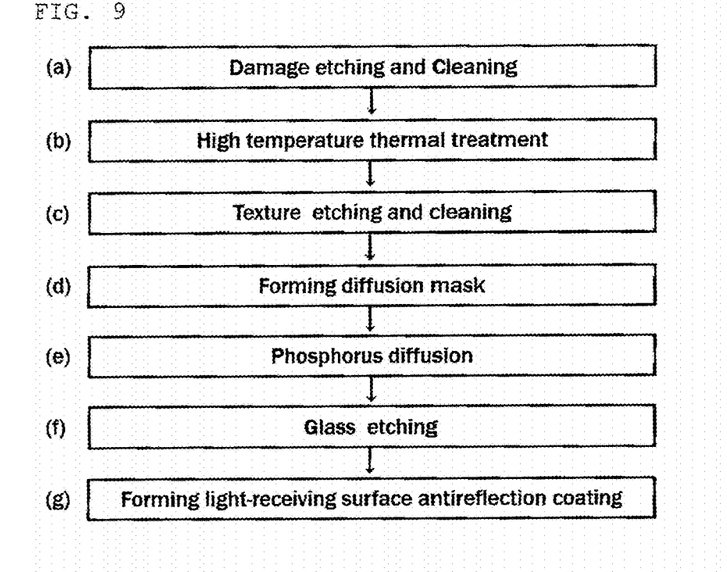
FIG. 9 is a flow diagram showing a process flow to manufacture the substrate for a solar cell of FIG. 7.

The following specifically describes an example of a manufacturing method of the substrate for a solar cell 20 of FIG. 7 (an embodiment using a gallium-doped substrate) by reference to FIG. 9. Explanations overlapping with those of the embodiment using a phosphorus-doped substrate described already will be omitted appropriately.

First, the gallium-doped silicon substrate 101 sliced from a silicon single crystal ingot is cleaned after removing the damaged layer (see FIG. 9(a)).

The gallium-doped silicon substrate 101 with the damaged layer being removed is subjected to high temperature thermal treatment at a temperature of 1200° C. or more for 30 seconds or more (see FIG. 9(b)).

Then, the gallium-doped silicon substrate 101 after the high temperature thermal treatment is subjected to texture etching, followed by cleaning (see FIG. 9(c)). This texture forming step may be performed before or after the step of the high temperature thermal treatment.

Subsequently, a diffusion mask for forming the emitter layer 112 is formed on the gallium-doped silicon substrate 101 subjected to the texture etching (see FIG. 9(d)). The diffusion mask can be formed by putting the gallium-doped silicon substrate 101 into a horizontal furnace, and growing the oxide film by thermal oxidation, followed by etching of the one side.

Next, the gallium-doped silicon substrate 101 having the diffusion mask formed thereon is subjected to phosphorus diffusion (see FIG. 9(e)). The phosphorus diffusion can be performed by putting the gallium-doped silicon substrate 101 into a horizontal furnace, followed by thermal treatment in an atmosphere of oxygen and $POCl_3$ gas, for example. It is also possible to reduce the production cost by putting two pieces of the gallium-doped silicon substrates 101, without forming diffusion masks described above, to one grove of a quartz boat such that the $POCl_3$ gas does not reach to the one side of each pieces in the diffusion, followed by forming a phosphorus diffusion layer onto another side of each pieces. The thermal treatment temperature at this stage is commonly about 800° C.

Then, the gallium-doped silicon substrate 101 is treated with hydrofluoric acid to remove phosphorus glass and a silicon oxide film formed on the surface thereof (see FIG. 9(f)).

Subsequently, the light-receiving surface antireflection coating 120 is formed on the light-receiving surface of the emitter layer 112 of the gallium-doped silicon substrate 101 (see FIG. 9(g)). The formation of the light-receiving surface antireflection coating 120 can be performed by forming a silicon nitride film by plasma CVD, for example.

In the foregoing way, the substrate for a solar cell 20 of FIG. 7 can be manufactured.

Figure 10:
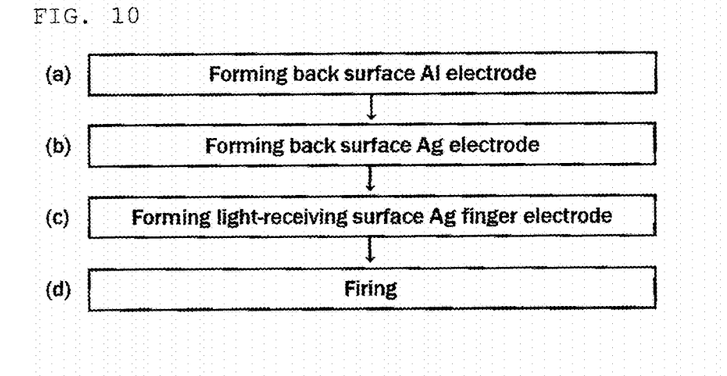
FIG. 10 is a flow diagram showing a working flow to fabricate the solar cell of FIG. 8.

The following describes an example of a method for fabricating the solar cell 21 of FIG. 8 by using the substrate for a solar cell 20 of FIG. 7 by reference to FIG. 10.

First, the back surface aluminum electrode 132 is formed on the back surface of the substrate for a solar cell 20 except for the bus bar electrode portion (see FIG. 10(a)). The back surface aluminum electrode 132 can be formed by screen printing of Al paste onto the back surface of the substrate for a solar cell 20, for example.

Subsequently, a silver electrode can be formed onto the bus bar electrode portion of the back surface of the substrate for a solar cell 20 by screen printing using silver paste (see FIG. 10(b)).

Then, the light-receiving surface electrode 130 is formed on the light-receiving surface of the light-receiving surface antireflection coating 120 of the substrate for a solar cell 20 (see FIG. 10(c)).

Next, firing is performed on the substrate for a solar cell 20 on which the back surface aluminum electrode 132 and the light-receiving surface electrode 130 are formed (see FIG. 10(d)). During this firing, aluminum diffuses from the back surface aluminum electrode 132 to the gallium-doped silicon substrate 101 to form the BSF layer (aluminum diffusion layer) 113. It is to be noted that the light-receiving surface electrode 130 and the emitter layer 112 can be electrically connected, by passing the light-receiving surface electrode 130 through the light-receiving surface antireflection coating 120 during the firing without forming opening in the light-receiving surface antireflection coating 120.

In the foregoing way, the solar cell 21 of FIG. 8 can be fabricated.

EXAMPLES

Hereinafter, the present invention will be more specifically described by showing Examples and Comparative Examples, but the present invention is not limited thereto.

Example 1

The substrate for a solar cell 10 of FIG. 3 was manufactured according to the production flow of FIG. 5. Provided that an n-type substrate with the resistivity of 1 Ω·cm (CZ method pulling, oxygen concentration of 17 to 18 ppm) was used as the phosphorus-doped silicon substrate 100, and the high temperature thermal treatment was performed in a horizontal furnace (using an SiC tube) under the conditions of 1250° C. for 5 minutes in a nitrogen atmosphere.

Figure 11A:
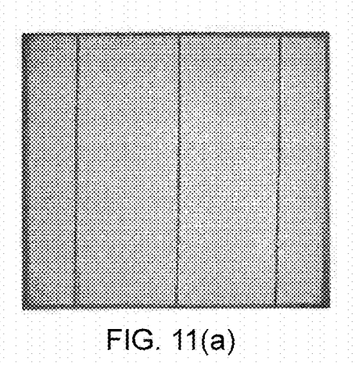
FIGS. 11(a) and (b) are diagrams showing EL images of solar cells each fabricated by using the substrate for a solar cell in Example 1 or Comparative Example 1.

By using the manufactured substrate for a solar cell, 100 pieces of solar cells 11 of FIG. 4 were fabricated according to the production flow of FIG. 6. The EL (electroluminescence) image of the fabricated solar cell is shown in FIG. 11(a). As can be seen from FIG. 11(a), a spiral oxygen-induced defect, which will be described below, is eliminated. The battery characteristics (short-circuit current density, open circuit voltage, fill factor, and conversion efficiency) were measured on the fabricated solar cells. The results are shown in Table 1. Herein, the short-circuit current density is a value of current density when the resistor connected to the solar cell shows resistance of 0Ω; the open circuit voltage is a voltage value when the resistor connected to the solar cell shows very large resistance; the fill factor (form factor) is the maximum generated electric power/(short-circuit current× open circuit voltage); and the conversion efficiency is (output from the solar cell/solar energy input to the solar cell)×100.

Example 2

The substrate for a solar cell 10 of FIG. 3 was manufactured in the same way as in Example 1. Provided that the high temperature thermal treatment was performed such that phosphorus diffusion was performed in a horizontal furnace (using an SiC tube) under the conditions of 1200° C. for 10 minutes in a POCl$_3$ atmosphere, thereby dissolving oxide precipitate defects and performing phosphorus getter (gettering with phosphorus).

By using the manufactured substrate for a solar cell, 100 pieces of solar cells 11 of FIG. 4 were fabricated in the same way as in Example 1. The battery characteristics (short-circuit current density, open circuit voltage, fill factor, and conversion efficiency) were measured on the fabricated solar cells. The results are shown in Table 1.

Comparative Example 1

The substrate for a solar cell 10 of FIG. 3 was manufactured in the same way as in Example 1. Provided that the high temperature thermal treatment was not performed.

Figure 11B:
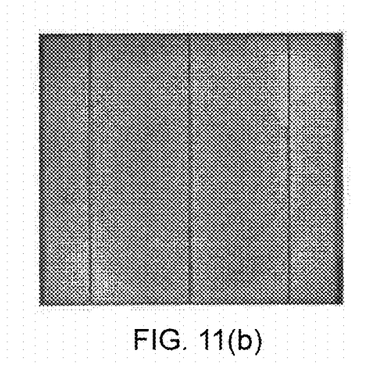

By using the manufactured substrate for a solar cell, 100 pieces of solar cells 11 of FIG. 4 were fabricated in the same way as in Example 1. The EL image of the fabricated solar cell is shown in FIG. 11(b). As can be seen from FIG. 11(b), a spiral oxygen-induced defect is observed. The battery characteristics (short-circuit current density, open circuit voltage, fill factor, and conversion efficiency) were measured on the fabricated solar cells. The results are shown in Table 1.

TABLE 1

|  | Short-circuit current density (standard deviation) | Open circuit voltage (standard deviation) | Fill factor (standard deviation) | Conversion efficiency (standard deviation) |
| --- | --- | --- | --- | --- |
| Example 1 | 39.3 mA/cm$^2$ (0.127 mA/cm$^2$) | 648 mV (1.69 mV) | 0.789 (0.00350) | 20.1% (0.094%) |
| Example 2 | 39.6 mA/cm$^2$ (0.122 mA/cm$^2$) | 650 mV (1.61 mV) | 0.789 (0.00367) | 20.3% (0.093%) |
| Comparative Example 1 | 38.2 mA/cm$^2$ (0.379 mA/cm$^2$) | 636 mV (3.96 mV) | 0.794 (0.00540) | 19.3% (0.385%) |

As can be seen from Table 1, the conversion efficiency was improved in Examples 1 to 2 compared to that of Comparative Example 1, each of which used a phosphorus-doped substrate. In each of Examples 1 to 2, the variations of characteristics of the solar cell (short-circuit current density, open circuit voltage, fill factor, and conversion efficiency) were reduced compared to those of Comparative Example 1. This is probably due to the high temperature thermal treatment performed in Examples 1 to 2, preventing oxygen-induced defects compared to Comparative Example 1 (see FIG. 11), in which the high temperature thermal treatment was not performed, thereby preventing decrease in the lifetime of the bulk portion of each substrate. It was also found that the conversion efficiency was more improved in Example 2, in which the high temperature thermal treatment was performed in a POCl$_3$ atmosphere.

Example 3

The substrate for a solar cell 20 of FIG. 7 was manufactured according to the production flow of FIG. 9. Provided that a p-type substrate with the resistivity of 1 Ω·cm (CZ method pulling, oxygen concentration of 17 to 18 ppm) was used as the gallium-doped silicon substrate 101, and the high temperature thermal treatment was performed in a horizontal furnace (using an SiC tube) under the conditions of 1250° C. for 5 minutes in a nitrogen atmosphere.

By using the manufactured substrate for a solar cell, 100 pieces of solar cells 21 of FIG. 8 were fabricated according to the production flow of FIG. 10. The battery characteristics (short-circuit current density, open circuit voltage, fill factor, and conversion efficiency) were measured on the fabricated solar cells. The results are shown in Table 2.

Example 4

The substrate for a solar cell 20 of FIG. 7 was manufactured in the same way as in Example 3. Provided that the high temperature thermal treatment was performed such that phosphorus diffusion was performed in a horizontal furnace (using an SiC tube) under the conditions of 1200° C. for 10 minutes in a POCl$_3$ atmosphere, thereby dissolving oxide precipitate defects and performing phosphorus getter.

By using the manufactured substrate for a solar cell, 100 pieces of solar cells 21 of FIG. 8 were fabricated in the same way as in Example 3. The battery characteristics (short-circuit current density, open circuit voltage, fill factor, and conversion efficiency) were measured on the fabricated solar cells. The results are shown in Table 2.

Comparative Example 2

The substrate for a solar cell 20 of FIG. 7 was manufactured in the same way as in Example 3. Provided that the high temperature thermal treatment was not performed.

By using the manufactured substrate for a solar cell, 100 pieces of solar cells 21 of FIG. 8 were fabricated in the same way as in Example 3. The battery characteristics (short-circuit current density, open circuit voltage, fill factor, and conversion efficiency) were measured on the fabricated solar cells. The results are shown in Table 2.

Example 5

The substrate for a solar cell 20 of FIG. 7 was manufactured in the same way as in Example 3. Provided that the high temperature thermal treatment was performed in a horizontal furnace (using an SiC tube) under the conditions of 1250° C. for 40 minutes in a nitrogen atmosphere.

By using the manufactured substrate for a solar cell, 100 pieces of solar cells 21 of FIG. 8 were fabricated in the same way as in Example 3. The battery characteristics (short-circuit current density, open circuit voltage, fill factor, and conversion efficiency) were measured on the fabricated solar cells. The results are shown in Table 2.

TABLE 2

|  | Short-circuit current density (standard deviation) | Open circuit voltage (standard deviation) | Fill factor (standard deviation) | Conversion efficiency (standard deviation) |
| --- | --- | --- | --- | --- |
| Example 3 | 38.3 mA/cm$^2$ (0.128 mA/cm$^2$) | 640 mV (1.71 mV) | 0.804 (0.00364) | 19.7% (0.095%) |
| Example 4 | 38.5 mA/cm$^2$ (0.132 mA/cm$^2$) | 643 mV (1.83 mV) | 0.804 (0.00371) | 19.9% (0.108%) |
| Comparative Example 2 | 37.5 mA/cm$^2$ (0.372 mA/cm$^2$) | 631 mV (3.93 mV) | 0.799 (0.00543) | 18.9% (0.377%) |
| Example 5 | 38.4 mA/cm$^2$ (0.137 mA/cm$^2$) | 638 mV (1.78 mV) | 0.783 (0.00440) | 19.2% (0.115%) |

As can be seen from Table 2, the conversion efficiency was also improved in Examples 3 to 5 compared to Comparative Example 2, each of which used a gallium-doped substrate. In each of Examples 3 to 5, the variations of characteristics of the solar cell (short-circuit current density, open circuit voltage, fill factor, and conversion efficiency) were reduced compared to Comparative Example 2. This is probably due to the high temperature thermal treatment performed in Examples 3 to 5, preventing oxygen-induced defects compared to Comparative Example 2, in which the high temperature thermal treatment was not performed, thereby preventing decrease in the lifetime of the bulk portion of each substrate. It was also found that the conversion efficiency was more improved in Example 4, in which the high temperature thermal treatment was performed in a POCl$_3$ atmosphere. Further, in Examples 3 to 4, with the high temperature thermal treatment being 30 minutes or less, the fill factor and the conversion efficiency were improved compared to those of Example 5, with the high temperature thermal treatment being more than 30 minutes. This is probably due to the high temperature thermal treatment performed for 30 minutes or less in Examples 3 to 4, preventing removal of gallium dopant from the substrate, thereby preventing the substrate from increasing the resistivity to increase the series resistance.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A method for manufacturing a solar cell, comprising:
preparing a Czochralski silicon single crystal ingot doped with a p-type dopant or an n-type dopant and containing oxygen atoms of at least 12 ppm;
preparing a silicon substrate from the Czochralski silicon single crystal ingot;
subjecting the silicon substrate to low temperature thermal treatment at a temperature of 800° C. or more and less than 1200° C. so as to fabricate a solar cell,
wherein either the Czochralski silicon single crystal ingot, or the silicon substrate, is subjected to, before the low temperature thermal treatment, high temperature thermal treatment at a temperature of more than 1200° C. for 5 minutes or more and 30 minutes or less, so that oxide precipitate nuclei are dissolved and a homogenous solid solution of oxide precipitate nuclei is formed throughout the silicon substrate;
subjecting the silicon substrate to texture etching before the high temperature thermal treatment; and
subjecting the fabricated solar cell to an electroluminescence image test to check that spiral oxygen-induced defect patterns are not observed;
wherein the conversion efficiency of the solar cell in which the spiral oxygen-induced defect patterns are not observed in the electroluminescence image test is about 20% and the variation thereof is about 0.1%.

* * * * *